(12) United States Patent
Khaira et al.

(10) Patent No.: US 7,319,947 B1
(45) Date of Patent: Jan. 15, 2008

(54) METHOD AND APPARATUS FOR PERFORMING DISTRIBUTED SIMULATION UTILIZING A SIMULATION BACKPLANE

(75) Inventors: Manpreet S. Khaira, Portland, OR (US); Erik M. Seligman, Beaverton, OR (US); Jeremy S. Casas, Portland, OR (US); Steve W. Otto, Portland, OR (US); Mandar S. Joshi, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 547 days.

(21) Appl. No.: 09/470,875

(22) Filed: Dec. 22, 1999

(51) Int. Cl.
*G06F 17/50* (2006.01)
*G06F 9/45* (2006.01)
*G06G 7/62* (2006.01)

(52) U.S. Cl. .................. 703/17; 716/3; 716/4; 716/6
(58) Field of Classification Search ............... 703/17; 716/3, 4, 6
See application file for complete search history.

(56) References Cited

U.S. PATENT DOCUMENTS

| | | | |
|---|---|---|---|
| 5,732,247 A * | 3/1998 | Dearth et al. | 703/13 |
| 5,881,267 A * | 3/1999 | Dearth et al. | 703/27 |
| 5,881,270 A * | 3/1999 | Worthington et al. | 703/21 |
| 5,907,695 A * | 5/1999 | Dearth | 703/17 |
| 6,108,494 A * | 8/2000 | Eisenhofer et al. | 703/14 |
| 6,175,946 B1 * | 1/2001 | Ly et al. | 716/4 |
| 6,182,258 B1 * | 1/2001 | Hollander | 714/739 |
| 6,339,836 B1 * | 1/2002 | Eisenhofer et al. | 716/5 |
| 6,484,281 B1 * | 11/2002 | Wang et al. | 714/733 |

* cited by examiner

*Primary Examiner*—Paul Rodriguez
*Assistant Examiner*—Dwin McTaggart Craig
(74) *Attorney, Agent, or Firm*—Kenyon & Kenyon LLP (57) ABSTRACT

A method and apparatus for performing distributed simulation is presented. According to an embodiment of the present invention, simulators are interfaced to a simulation backplane via simulator-dependent interfaces (SDI's). The simulators exchange messages via the simulation backplane and the SDI's. The SDI's convert the exchanged messages between a data format supported by the backplane and a data format supported by the simulator to which the interface is connected. By interfacing the simulators with the backplane via SDI's, the validation environment may be changed without reconfiguring the backplane.

48 Claims, 4 Drawing Sheets

METHOD AND APPARATUS FOR PERFORMING DISTRIBUTED SIMULATION UTILIZING A SIMULATION BACKPLANE

BACKGROUND

1. Field

The present invention pertains to performing distributed simulation utilizing a simulation backplane. More particularly, the present invention pertains to a simulation backplane arrangement wherein a simulation backplane having a fixed configuration may be utilized for performing the distributed simulation of a variety of different components or a variety of different systems based on processors and complex chipsets.

2. Background Information

Despite advances in formal techniques for verifying components such as integrated circuit chips and systems based on processors and complex chipsets, dynamic validation continues to be the main mechanism for validating components designed today. Dynamic simulation may be defined as a method for validating a circuit design wherein the method comprises the following steps: creating a computer executable program (for example, a "simulator") that emulates the behavior of the specified circuit design, examining the behavior of the circuit by stimulating the simulator using a set of tests, and analyzing the simulator's response to the specified tests. Distributed simulation is a form of dynamic simulation wherein the simulator is partitioned into a number of smaller simulators. Each of the smaller simulators may be executed independently which allows for distribution across different workstations and allows the simulators to be run in parallel. However, current methods for performing distributed simulation at different levels of hierarchy (such as unit, cluster, component and system) require design teams to expend significant time and effort in setting up validation environments. In addition, the current process of setting up validation environments inherently includes wasted effort due to rediscovery and reconfiguration.

For example, one known method for setting up a validation environment for performing distributed simulation entails writing and executing computer programs which mimic the functions of a component or system. These computer programs are known as simulators. For example, to validate a circuit comprising a plurality of interacting integrated circuit chips, one simulator may be written to mimic the functions of each integrated circuit chip. In addition to the simulators, a computer program known as a driver may be written to stimulate the simulators and a computer program known as a checker may be written to analyze how the simulators respond to stimulus messages from the driver. A computer program known as a simulation backplane typically provides a communications fabric for interconnecting the simulators, drivers and checkers. Unfortunately, current methods entail reconfiguring the simulation backplane computer program each time a simulator is changed or added. Thus, a significant amount of the time spent setting up a validation environment is wasted in the process of reconfiguring the simulation backplane.

Accordingly, there is a need for a method and apparatus which solves the above described problems.

SUMMARY

According to an embodiment of the present invention, a method for performing distributed simulation is proposed. The method first entails providing at least two simulators. At least one of the at least two simulators represents either a component or a system based on processors and chipsets. Next, an interface is associated with each of the at least two simulators. Each of the at least two simulators is then interfaced with a backplane via the interface associated with each of the at least two simulators without performing a reconfiguration of the backplane. Messages are exchanged between the at least two simulators via the simulation backplane and the associated interfaces, wherein each interface converts messages between a data format associated with the backplane and a data format associated with the simulator associated with the interface.

DETAILED DESCRIPTION

The present invention pertains to a simulation backplane arrangement wherein the same simulation backplane may be utilized for performing the distributed simulation of a variety of different components or a variety of different systems based on processors and complex chipsets. The main components of the arrangement are a set of software-based simulator-dependent interfaces (SDI's) and a universal software-based simulation backplane having a fixed configuration. To set up a validation environment, simulators are interfaced with the backplane via SDI's. As used herein, the term "simulator" may refer to a computer program which mimics a model, a driver or a checker process. The SDI is a computer program that transfers a simulator's signals to and from the backplane. Only one SDI needs to be written for each simulator type. The backplane provides the communication fabric for interconnecting the simulators. By interfacing the simulators with the fixed configuration backplane via SDI's, the validation environment may be changed without reconfiguring the backplane.

Figure 1:
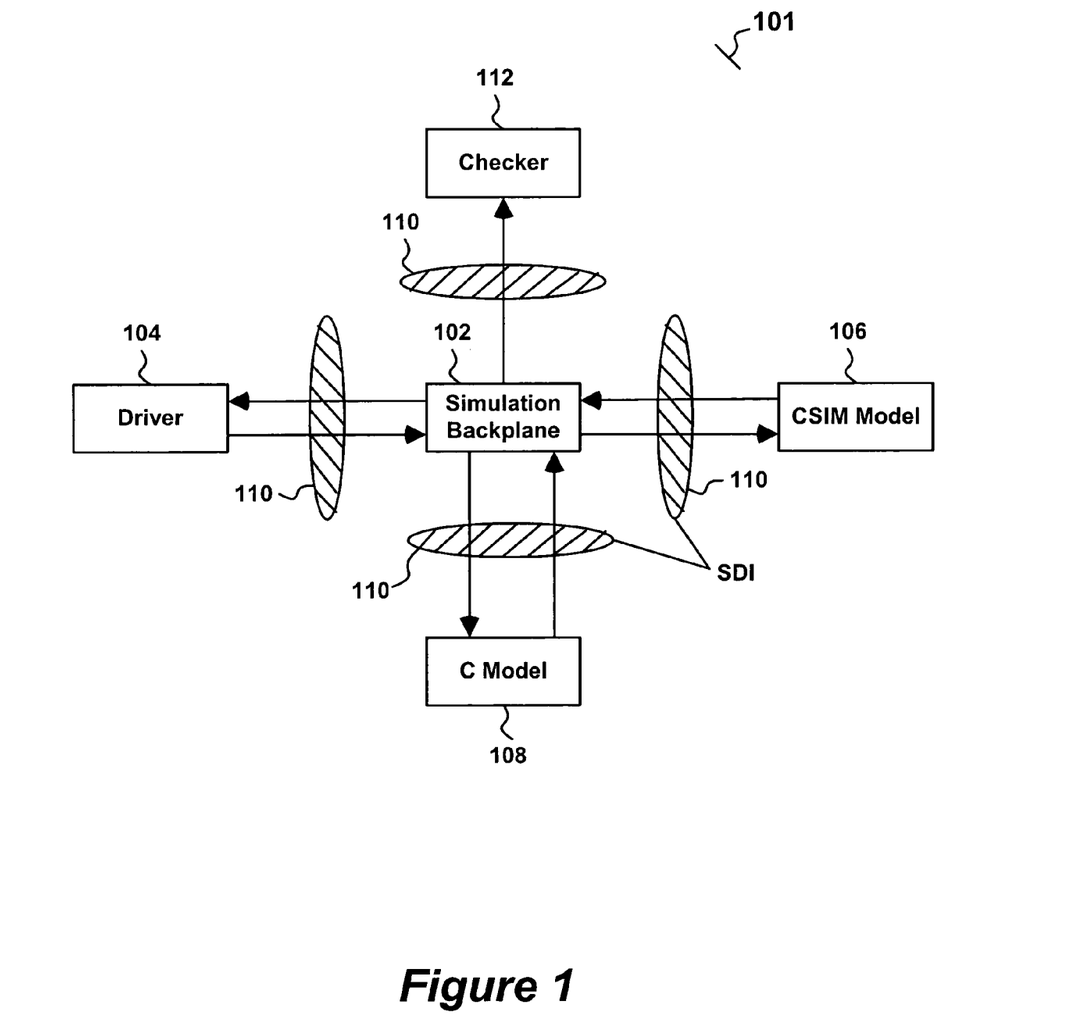
FIG. 1 shows a validation environment comprising a simulation backplane, four simulators, and four SDI's according to an embodiment of the present invention.

The arrangement of the present invention provides a comprehensive solution for system, component and design validation. A typical distributed simulation involves running many simulators corresponding to different components as independent processes. FIG. 1 shows a validation environment comprising a simulation backplane, four simulators, and four SDI's according to an embodiment of the present invention. In FIG. 1, a driver 104, a checker 112, a C model 108 of an integrated circuit chip and a simulator (CSIM) model 106 of an integrated circuit chip are interfaced with a simulation backplane 102 via SDI's 110. Each of the components shown in FIG. 1 correspond to algorithms which may be implemented as computer programs in any programming language such as C++. These computer programs may be executed on one workstation, a cluster of workstations or on highly-parallel computers such as the Paragon™ (available from Intel Corporation, Santa Clara, Calif.).

CSIM model 106 and C model 108 are simulators which mimic an integrated circuit chip at different levels of abstraction. Backplane 102 connects these two models of the integrated circuit chip. During the process of performing a distributed simulation, data messages representing input stimuli from the driver 104 are forwarded by the simulation backplane 102 to the models 106 and 108. The models 106 and 108 operate on the data and return response messages to the simulation backplane 102. The simulation backplane 102 then forwards the response messages to checker 112. Checker 112 then determines whether the models performed as expected by comparing the received response messages with predetermined values. The driver 104, the models 106 and 108, and the checker 112 exchange messages with the simulation backplane 102 via corresponding SDI's 110. Each SDI converts the exchanged messages between the data format supported by its corresponding simulator and the data format supported by the simulation backplane. Thus, simulation backplane 102 may implement a common data format when communicating with any simulator, driver, or checker.

Figure 2:
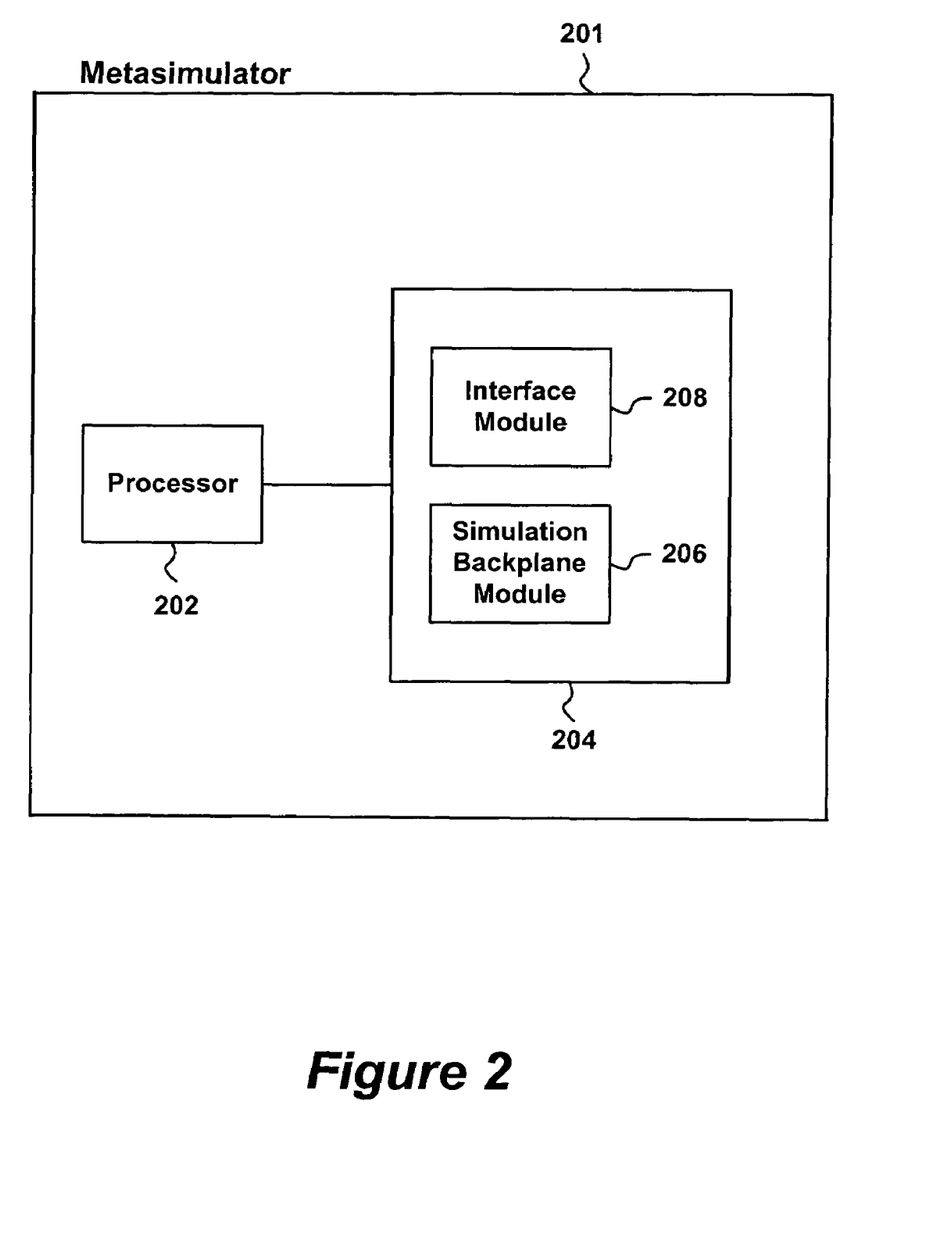
FIG. 2 shows an example of an apparatus suitable for performing distributed simulation according to an embodiment of the present invention.

FIG. 2 shows an apparatus suitable for performing distributed simulation according to an embodiment of the present invention. In FIG. 2, a metasimulator 201 comprises a processor 202 adapted to be connected to a computer readable memory segment 204. Processor 202 may be, for example a Pentium® II Processor (available from Intel Corporation, Santa Clara, Calif.). Computer readable memory 204 stores computer program code segments which, when executed by processor 202, implement the main functionality for this embodiment of the invention. These computer program code segments are included within a simulation backplane module 206 and an interface module 208. Although in this embodiment of the invention the computer program code segments are shown in two modules, it can be appreciated that these modules can be combined into one module or further separated into more modules and still fall within the scope of the invention.

Figure 3:
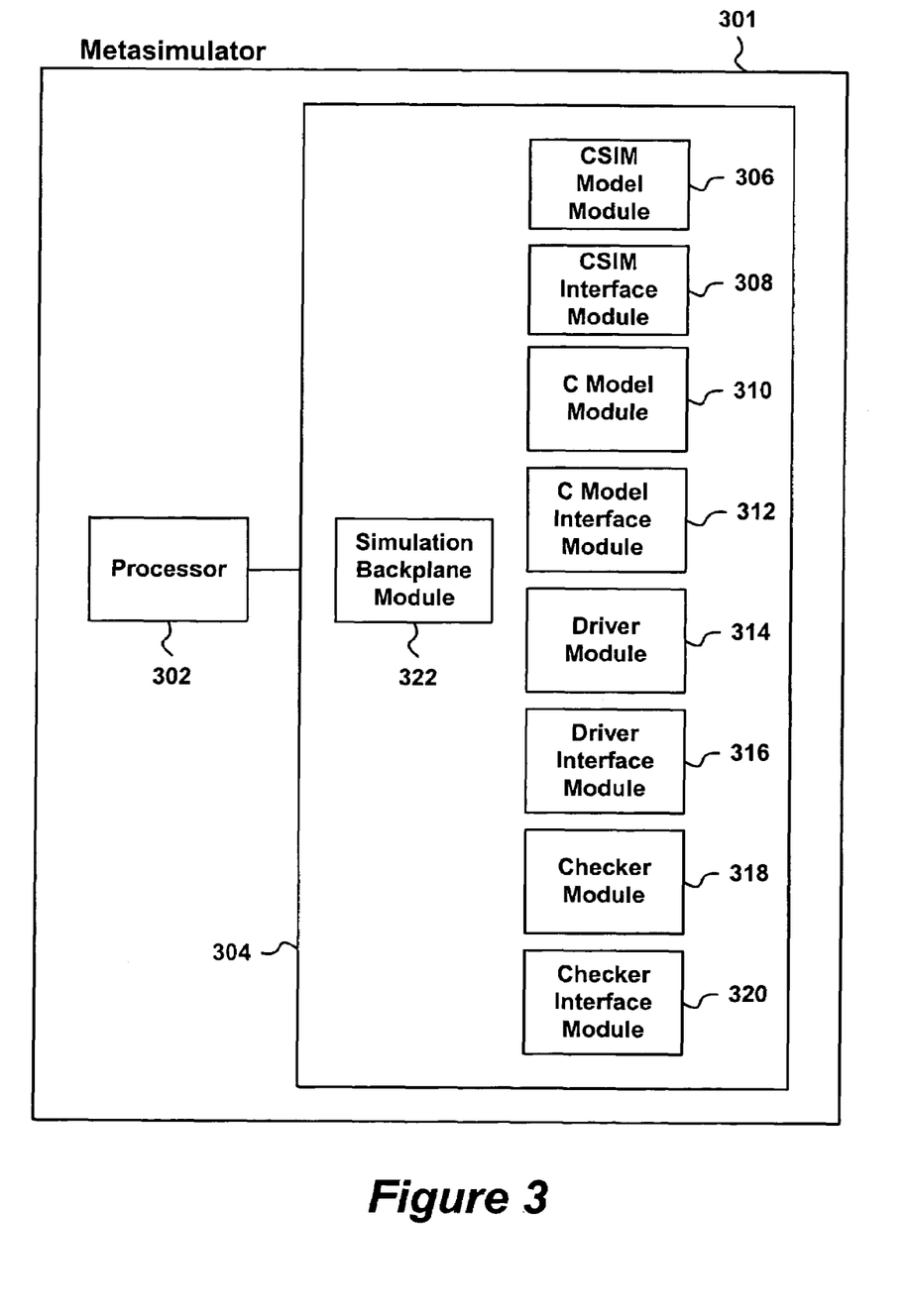
FIG. 3 shows an example of the apparatus of FIG. 2 modified to implement the validation environment of FIG. 1 according to an embodiment of the present invention.

FIG. 3 shows the apparatus of FIG. 2 modified to implement the validation environment of FIG. 1 according to an embodiment of the present invention. In addition to the corresponding elements described above with respect to FIG. 2, metasimulator 301 of FIG. 3 includes a CSIM model module 306, a C model module 310, a driver module 314, and a checker interface module 320 which respectively correspond to the similarly named simulators of FIG. 1. Metasimulator 301 also includes the following modules which correspond to the SDI's 110 of FIG. 1: CSIM interface module 308, C mode interface module 312, driver interface module 316, and checker interface module 320. The interface modules interface their similarly named simulator modules with simulation backplane module 322. When executed by processor 302, the modules of FIG. 3 implement the distributed simulation method of the present invention in a manner similar to that described above with respect to FIG. 1.

Figure 4:
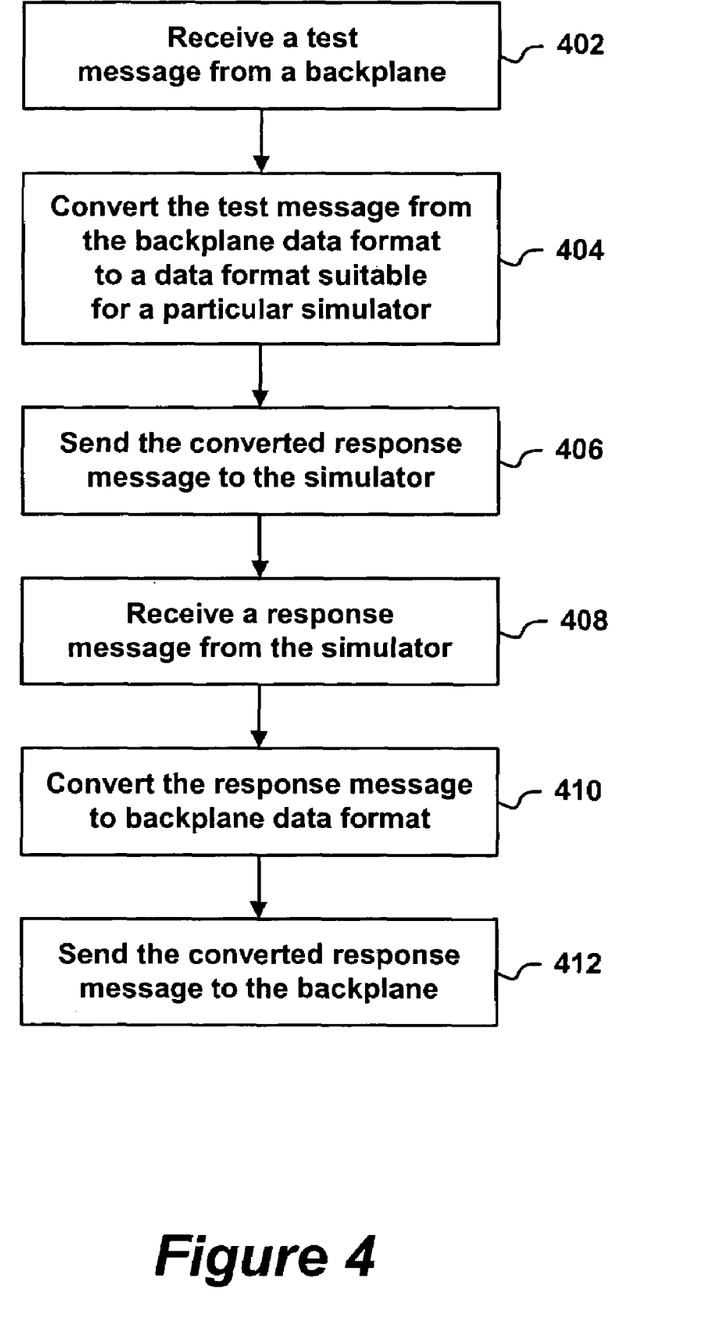
FIG. 4 shows a flow chart with an example of the steps which may be implemented by an SDI according to an embodiment of the present invention.

FIG. 4 shows a flow chart with an example of the steps which may be implemented by an SDI according to an embodiment of the present invention. These steps may be stored, for example, as computer program code segments within interface module 208 of FIG. 2 or within any of the interface modules of FIG. 3. In step 402, the SDI receives a test message from a backplane such as backplane 102 of FIG. 1 (or one of the backplane modules shown in either FIG. 2 or FIG. 3). In step 404, the SDI converts the test message from the backplane's data format to a format suitable for the simulator this particular SDI is interfacing with the backplane. In step 406, the SDI sends the converted test message to the simulator. In step 408, the SDI receives a response message from the simulator. In step 410, the SDI converts the response message to the backplane's data format. In step 412, the SDI sends the converted test message to the backplane.

In addition to the above described features, various combinations of other features may be implemented by embodiments within the context of the present invention. For example, efficient tree-based communication between simulators may be implemented either with the backplane as a central controlling process or in which all the SDI's participate. The height of the tree may be logarithmic to accommodate large numbers of simulators.

In another feature, all messages (signals) which need to be communicated between the simulators may be gathered together into a global signal vector. In one embodiment of the present invention, the messages which will be included within the global signal vector are designated by setting up one or more configuration files prior to running the simulation. The contents of the global signal vector are available to each simulator which is interfaced with a particular backplane. In one embodiment of the present invention, the backplane merges all copies of the global signal vector and signal locations are stored within internal SDI tables for increased efficiency.

The present invention may run in a cycle-based manner. Thus, the system may need to be globally relaxed before the simulators may communicate with each other. In general terms, relaxation entails making sure that all simulators are at a stable state. In one embodiment, the relaxation method of the present invention entails dividing the simulators into two classes. The first class of simulators are referred to as "tickers." Tickers are usually drivers or checkers whose values remain constant. The second class of simulators are referred to as "relaxers." Relaxers are simulators which need to locally relax prior to communicating with other simulators. The relaxation method of the present invention is more efficient than those methods currently known in the art because the tickers are left out of the relaxation process and relaxation focuses only on those simulators which need to relax.

The present invention may support a system comprising both cycle based and event based simulators. Cycle based simulators respond to clock edges. Event based simulators may respond during a time period (referred to herein as a "cycle") between clock edges. Although cycle based simulators may be relaxed while holding the simulator at one particular clock edge, event based simulators must move forward in time to accomplish relaxation. In one embodiment of the present invention, relaxation of a system comprising cycle based and event based simulators is initiated upon the arrival of a designated clock edge. The cycle based simulators are held at the designated clock edge until they have been relaxed. The event based simulators are relaxed by incrementally advancing time along a cycle from the designated clock edge until they are relaxed. The duration of each incremental time advance is chosen so that the event based simulators are relaxed prior to the arrival of the next clock edge following the designated clock edge. When the next clock edge following the designated clock edge arrives, both the cycle based and event based simulators have been relaxed. This technique allows the present invention to globally relax a system comprising both cycle based and event based simulators without advancing the global simulation cycle time.

Another embodiment of the present invention may provide a deadlock-free remote procedure call (RPC) capability. In general terms, the RPC capability enables a user to dynamically alter the global signal vector by using one simulator to request a service from another simulator. As explained in more detail below, the RPC capability may be used (for example) to add messages to the global signal vector after the simulation has begun. An asynchronous (as used herein, asynchronous means a single simulator can initiate the RPC) RPC mechanism is provided, in a provably deadlock-free manner and with minimal impact on overall simulation performance. Extra flags appear in the global signal vector which can be set by any simulator at any time. When these flags are set, the distributed system enters RPC mode. During RPC mode, each simulator (in a pre-determined and fixed order) can make RPC calls. Since no simulator can request an RPC while servicing another RPC, a cyclic dependency cannot exist and the mechanism is deadlock-free. The global flags have little efficiency impact during normal operation.

The above described RPC mechanism may be implemented, for example, to add a signal to the signal vector after the simulation has begun. In one embodiment of the present invention, the process of adding an additional signal is begun by first using a requesting simulator or a checker to send a message (via the backplane) to the simulator which has the desired signal. This message requests the simulator to add the signal to the signal vector. In addition, each of the other simulators are requested to accommodate the new signal which will be added. To provide universality between a wide variety of simulators, the present invention supports several multiple-bit encodings of signal values. For example, the very high speed integrated circuit hardware description language (VHDL) signal representation in accordance with IEEE 1164 (1164-1993 IEEE Standard Multivalue Logic System for VHDL Model Interoperability) standard logic may be encoded using five bits. The present invention may also support an extendible signal encoding mechanism, whereby any encoding required by a new type of simulator can be created using a set of primitives provided by the present invention.

In the general case, signals representing messages exchanged via the simulation backplane may have several strength values, and when several simulators set the same signal, a conflict may arise. This conflict may be properly resolved via a Least Upper Bound (LUB) operation. In one embodiment of the present invention, a careful encoding of the signal strengths enables the LUB operation to be accomplished by a simple bitwise-OR operation. Known modern simulators often provide a word-parallel mode, whereby multiple test vectors are simulated simultaneously and with little slowdown. For example, rather than utilizing one bit of a 32-bit computer word to execute a test signal, a word-parallel mode capable simulator may utilize all 32 bits of the 32-bit computer word to execute 32 different test signals in approximately the same amount of time one test may be executed. The present invention supports this capability by easily allowing multiple copies of each signal and by simple functions that allow an SDI access to individual signal instances. In one embodiment of the present invention, the backplane may expand the signal vector to accommodate the transmission of a word-parallel mode message sent from a word-parallel mode capable simulator. An SDI associated with a non-word-parallel mode capable simulator may then convert the received word-parallel mode message into a format which may be recognized by the non-word-parallel mode capable simulator.

A situation occurs when a distributed bus is set to a new value by a simulator. When the simulator sets the value and then receives the same value, the simulator is not able to distinguish whether there is a remote driver of the value or whether the simulator is receiving an echo of the value it previously sent out. In one embodiment of the present invention, a novel protocol is used wherein each simulator sends out only the value it is actively driving. The backplane LUB operation preserves enough information so that the SDI can locally determine the correctly resolved value of the bus.

Another embodiment of the present invention may include the ability to run simulations with components running at different frequencies. It is common to have the integrated circuit chip-set run at a different frequency than the microprocessor. Very often the ratio of frequencies are not whole numbers. For example, JTAG Boundary-Scan products in accordance with IEEE 1149.1 (1149.1-1990 Standard Test Access Port and Boundary-Scan Architecture) usually run at a much lower frequency than the processor.

Design validation tests can be written using High-Level Language (HLL) primitives. Because, in one embodiment of the present invention, the driver may have complete access to the state of the models, the test can include statements that allow different primitives to be executed based on the current state of signals in the model ("reactive"). This is an especially powerful feature for testing boundary conditions.

One embodiment of the present invention may support easy test storage and replay. Since all the tests are run as a separate process, they can be stored and rerun easily. The same handwritten tests or Automated Test Generation (ATG) generated tests can be used for all simulators. The simulation backplane and the SDIs may be configured to implement the translations.

The present invention may support protocol checkers. A protocol checker (for example written in C++) may be a stand-alone program and may be used with an arbitrary collection of simulators.

Although several embodiments are specifically illustrated and described herein, it will be appreciated that modifications and variations of the present invention are covered by the above teachings and within the purview of the appended claims without departing from the spirit and intended scope of the invention.

What is claimed is:

1. A method for performing distributed simulation, comprising:
   providing at least two simulators, wherein at least one of the at least two simulators represents at least one of a component and a system based on processors and chipsets;
   providing a backplane having a fixed configuration;
   associating an interface with each of the at least two simulators;
   interfacing each of the at least two simulators with the fixed configuration backplane via the interface associated with each of the at least two simulators;
   exchanging messages between the at least two simulators via the fixed configuration backplane and the associated interfaces; and
   operating each interface to convert the messages between a data format associated with the fixed configuration backplane and a data format associated with the simulator associated with the interface.

2. The method of claim 1, wherein at least one of the at least two simulators is a driver.

3. The method of claim 1, wherein at least one of the at least two simulators is a checker.

4. The method of claim 1, wherein at least one of the at least two simulators is a model.

5. The method of claim 1, wherein the component is an integrated circuit chip.

6. The method of claim 1, wherein communication between the at least two simulators is based upon one of a central controlling process and a tree.

7. The method of claim 1, wherein only the simulators requiring relaxation are relaxed prior to exchanging messages.

8. The method of claim 1, wherein a system comprising both cycle based simulators and event based simulators is relaxed by holding the cycle based simulators at a designated clock edge until the cycle based simulators are relaxed and by incrementally advancing time along a cycle from the designated clock edge until the event-based simulators are relaxed, the cycle based simulators and the event based simulators being relaxed before advancing a simulation time.

9. The method of claim 1, further comprising:
executing a deadlock-free remote procedure call function.

10. The method of claim 9, further comprising:
adding new signals to the backplane global signal vector utilizing the remote procedure call capability.

11. The method of claim 1, further comprising:
executing multiple-bit encodings of the exchanged messages to enable simulators based on different encoding schemes to communicate via the simulation backplane.

12. The method of claim 1, further comprising:
resolving a conflict between a signal strength of messages exchanged via the simulation backplane utilizing a least upper bound operation accomplished by a bitwise-OR operation.

13. The method of claim 1, wherein messages are exchanged in a manner which accommodate both word-parallel mode capable simulators and non-word-parallel mode capable simulators.

14. The method of claim 1, further comprising:
executing a protocol such that a simulation backplane least upper bound operation preserves enough information to enable each interface to locally determine and correctly resolve a value of messages exchanged via the simulation backplane.

15. The method of claim 1, further comprising:
exchanging messages in a manner which accommodate simulators running at different frequencies.

16. The method of claim 1, wherein design validation tests can be written using High-Level Language (HLL) primitives.

17. The method of claim 1, wherein one of a same handwritten test and an ATG generated test can be used for all simulators.

18. The method of claim 1, wherein a protocol checker may be used with an arbitrary collection of simulators.

19. A method for performing distributed simulation, comprising:
providing at least two simulators, wherein at least one of the at least two simulators represents at least one of a component and a system based on microprocessors and complex chipsets;
associating an interface with each of the at least two simulators;
interfacing each of the at least two simulators with a simulation backplane via the interface associated with each of the at least two simulators without performing a reconfiguration of the backplane;
exchanging messages between the at least two simulators via the simulation backplane and the associated interfaces;
changing a combination of the at least two simulators and associated interfaces without performing a reconfiguration of the simulation backplane;
wherein each interface converts messages between a data format associated with the backplane and a data format associated with the simulator associated with the interface.

20. The method of claim 19, wherein at least one of the at least two simulators is a driver.

21. The method of claim 19, wherein at least one of the at least two simulators is a checker.

22. The method of claim 19, wherein at least one of the at least two simulators is a model.

23. The method of claim 19, wherein the component is an integrated circuit chip.

24. A method for validating a component, comprising:
sending a test message from a backplane to an interface;
converting the test message from a first data format into a second data format, utilizing the interface;
sending the converted test message from the interface to at least one of the component and at least one model of the component;
receiving, at the interface and in response to the converted test message, a response message from at least one of the component and the at least one model of the component, the response message being in the second data format;
converting the response message from the second data format to the first data format, utilizing the interface;
sending the converted response message to the backplane; and
comparing the converted response message to a predetermined value.

25. The method of claim 24, wherein the component is an integrated circuit chip.

26. The method of claim 24, wherein the comparing step is accomplished utilizing a checker.

27. A method for validating a component, comprising:
receiving a test message from a backplane;
converting, utilizing an interface, the test message from a first data format to a second data format;
sending the test message to at least one of the component and at least one model of the component;
receiving, in response to the test message, a response message from at least one of the component and the at least one model of the component;
converting, using an interface, the response message from the second data format to the first data format;
sending the response message to a first device via a backplane; and
comparing the response message to a predetermined value utilizing the first device.

28. The method of claim 27, wherein the component is an integrated circuit chip.

29. The method of claim 27, wherein the first device is a checker.

30. The method of claim 27, wherein the test message is received from a second device.

31. The method of claim 30, wherein the second device is a driver.

32. The method of claim 30, wherein the second component is one of another integrated circuit chip and a model of another integrated circuit chip.

33. An apparatus for validating a component, comprising:
a processor;
a computer readable memory segment adapted to be connected to said processor;
an interface module stored within the computer readable memory segment;
a simulation backplane module within the computer readable memory segment, the simulation backplane module comprising computer program code segments which, when executed by the processor, implement the steps of:
receiving a test message from a first device;
sending the test message to at least one of the component and at least one model of the component via the interface module which converts the test message from a first data format to a second data format;
receiving a response message from at least one of the component and the at least one model of the component via the interface module which converts the response message from the second data format to the first data format; and
sending the response message to a second device, the second device comparing the response message to a predetermined value.

34. The apparatus of claim 33, wherein the component is an integrated circuit chip.

35. The apparatus of claim 33, wherein the first device is a driver.

36. The apparatus of claim 33, wherein the first device is one of another component and a model of another component.

37. The method of claim 33, wherein the second device is a checker.

38. An apparatus for validating a component, comprising:
a processor;
a computer readable memory segment adapted to be connected to said processor;
a simulation backplane module within the computer readable memory segment;
an interface module stored within the computer readable memory segment, the interface module comprising computer program code segments which, when executed by said processor, implement the steps of:
receiving a test message from the simulation backplane module;
converting the test message from a first data format to a second data format;
sending the test message to at least one of the component and at least one model of the component;
receiving, in response to the test message, a response message from at least one of the component and the at least one model of the component;
converting the response message from the second data format to the first data format; and
sending the response message to a first device via the simulation backplane module, the first device comparing the response message to a predetermined value.

39. The apparatus of claim 38, wherein the component is an integrated circuit chip.

40. The apparatus of claim 38, wherein the first component is a checker.

41. The method of claim 38, wherein the test message is received from a second device.

42. The method of claim 41, wherein the second device is a driver.

43. The method of claim 41, wherein the second device is one of another component and a model of another component.

44. A method for performing distributed simulation, comprising:
providing at least two simulators, wherein at least one of the at least two simulators represents at least one of a component and a system based on processors and chipsets;
associating an interface with each of the at least two simulators;
interfacing each of the at least two simulators with a simulation backplane via the interface associated with each of the at least two simulators without performing a reconfiguration of the backplane; and
exchanging messages between the at least two simulators via the simulation backplane and the associated interfaces;
wherein each interface converts messages between a data format associated with the backplane and a data format associated with the simulator associated with the interface.

45. An article, comprising:
a storage medium having stored thereon instructions when executed by a processor cause a system to validate a component by performing the following steps:
providing at least two simulators, wherein at least one of the at least two simulators represents at least one of a component and a system based on processors and chipsets;
providing a backplane having a fixed configuration;
associating an interface with each of the at least two simulators;
interfacing each of the at least two simulators with the fixed configuration backplane via the interface associated with each of the at least two simulators;
exchanging messages between the at least two simulators via the fixed configuration backplane and the associated interfaces; and
operating each interface to convert the messages between a data format associated with the fixed configuration backplane and a data format associated with the simulator associated with the interface.

46. An article, comprising:
a storage medium having stored thereon instructions when executed by a processor cause a system to validate a component by performing the following steps:
receiving a test message from a backplane;
converting, utilizing an interface, the test message from a first data format to a second data format;
sending the test message to at least one of the component and at least one model of the component;
receiving, in response to the test message, a response message from at least one of the component and the at least one model of the component;
converting, utilizing an interface, the response message from the second data format to the first data format;
sending the response message to a first device via a backplane; and
comparing the response message to a predetermined value utilizing the first device.

47. An article, comprising:
a storage medium having stored thereon instructions when executed by a processor cause a system to validate a component by performing the following steps:

sending a test message from a backplane to an interface;
converting the test message from a first data format into a second data format, utilizing the interface;
sending the converted test message from the interface to at least one of the component and at least one model of the component;
receiving, at the interface and in response to the converted test message, a response message from at least one of the component and the at least one model of the component, the response message being in the second data format;
converting the response message from the second data format to the first data format, utilizing the interface;
sending the converted response message to the backplane; and
comparing the converted response message to a predetermined value.

48. The method of claim 1, wherein exchanged messages are gathered together into a global signal vector.

* * * * *